United States Patent [19]
Dalal et al.

[11] Patent Number: 6,133,139
[45] Date of Patent: Oct. 17, 2000

[54] SELF-ALIGNED COMPOSITE INSULATOR WITH SUB-HALF-MICRON MULTILEVEL HIGH DENSITY ELECTRICAL INTERCONNECTIONS AND PROCESS THEREOF

[75] Inventors: Hormazdyar M. Dalal, Milton, N.Y.; Du Binh Nguyen, Danbury, Conn.; Hazara S. Rathore, Stormville, N.Y.

[73] Assignee: International Business Machines Corporation, Armonk, N.Y.

[21] Appl. No.: 08/947,244

[22] Filed: Oct. 8, 1997

[51] Int. Cl.[7] ............... H01L 21/44; H01L 21/4763; H01L 23/485; H01L 23/52
[52] U.S. Cl. ............... 438/624; 438/618; 438/622; 438/629; 438/631; 438/633; 438/634; 438/637; 438/674; 438/675; 257/750; 257/752; 257/760; 257/762; 257/763; 257/764; 257/765; 257/766
[58] Field of Search ............... 438/624, 595, 438/627, 622, 618; 156/662

[56] References Cited

U.S. PATENT DOCUMENTS

| | | | |
|---|---|---|---|
| 3,837,907 | 9/1974 | Berglund et al. | 117/212 |
| 4,309,812 | 1/1982 | Horng et al. | 29/578 |
| 4,622,058 | 11/1986 | Leary-Renick et al. | 65/105 |
| 5,252,516 | 10/1993 | Nguyen et al. | 437/195 |
| 5,284,549 | 2/1994 | Barnes et al. | 156/662 |
| 5,326,426 | 7/1994 | Tam et al. | 156/643 |
| 5,403,779 | 4/1995 | Joshi et al. | 437/190 |
| 5,404,635 | 4/1995 | Das | 29/603 |
| 5,434,451 | 7/1995 | Dalal et al. | 257/768 |
| 5,466,639 | 11/1995 | Ireland | 437/195 |
| 5,518,963 | 5/1996 | Park | 437/195 |
| 5,707,901 | 1/1998 | Cho et al. | 438/595 |
| 5,736,458 | 4/1998 | Teng | 438/627 |
| 5,792,704 | 8/1998 | Jun et al. | 438/624 |
| 5,792,705 | 8/1998 | Wang et al. | 438/624 |
| 5,795,820 | 8/1998 | Kepler | 438/624 |
| 5,801,094 | 9/1998 | Yew et al. | 438/624 |
| 5,827,776 | 10/1998 | Bandyopadhyay et al. | 438/624 |
| 5,840,624 | 11/1998 | Jang et al. | 438/624 |
| 5,846,876 | 12/1998 | Bandyopadhyay et al. | 438/622 |

*Primary Examiner*—Tom Thomas
*Assistant Examiner*—Bernard E. Souw
*Attorney, Agent, or Firm*—Aziz M. Ahsan

[57] ABSTRACT

The present invention relates generally to a new sequence of methods and materials to improve the process yield and to enhance the reliability of multilevel interconnection with sub-half-micron geometry by making judicious use of composite insulators to prevent metal thinning over hard metal via plugs and by preventing process induced metal spike formation. The method takes advantage of the double damascene process. The metal spikes and the metal thinning resulting from over etch process is prevented in this method by using a pair of insulators which require different chemistries for etching.

33 Claims, 6 Drawing Sheets

SELF-ALIGNED COMPOSITE INSULATOR WITH SUB-HALF-MICRON MULTILEVEL HIGH DENSITY ELECTRICAL INTERCONNECTIONS AND PROCESS THEREOF

CROSS-REFERENCE TO RELATED PATENT APPLICATIONS

This patent application is related to U.S. patent application Ser. No. 08/841,221, filed on Apr. 29, 1997, entitled, "SUB-HALF-MICRON MULTI-LEVEL INTERCONNECTION STRUCTURE AND PROCESS THEREOF", U.S. patent application Ser. No. 08/840,432, filed on Apr. 29, 1997, entitled, "SUB-HALF-MICRON MULTI-LEVEL INTERCONNECTION STRUCTURE", U.S. patent application Ser. No. 08/866,777, filed on May 30, 1997, entitled, "COPPER INTERCONNECTIONS WITH ENHANCED ELECTROMIGRATION RESISTANCE AND REDUCED DEFECT SENSITIVITY AND METHOD OF FORMING SAME", and U.S. patent application Ser. No. 08/947,277, filed on Oct. 8, 1997, entitled, "SUB-QUARTER-MICRON COPPER INTERCONNECTIONS WITH IMPROVED ELECTROMIGRATION RESISTANCE AND REDUCED DEFECT SENSITIVITY", all of which are presently assigned to the assignee of the instant application and the disclosure of which is incorporated herein by reference.

FIELD OF THE INVENTION

The present invention relates generally to a new semiconductor manufacturing, and more specifically to methods of forming interconnect structures in integrated circuits with improved circuit performance, reliability and process yield.

BACKGROUND OF THE INVENTION

Current interconnection technologies conventionally use tungsten or polysilicon to make contacts to devices and also to act as a short local interconnect lines. These local interconnect lines are then joined to high conductivity interconnection lines (say $M_1$) on a higher plane through tungsten via-plugs. The local interconnects are separated from the $M_1$ layer usually by a layer of phospho-silicate glass (PSG).

The via-interconnection between the first high conductivity metal lines ($M_1$) and the next level of high conductivity metal lines (say $M_2$) is preferably made with the same high conductivity metal instead of tungsten.

Various other schemes for multilevel interconnection, and more particularly for utilization of a composite insulator, are taught in the prior art.

U.S. Pat. No. 3,837,907 (Berglund et al.) and U.S. Pat. No. 4,309,812 (Horng et al.) use a scheme, where composite insulators with different etching characteristics are used to make an overhung structure of insulator layers in order to reduce the spacing between the adjacent features. Berglund uses this scheme to reduce the spacing between the adjacent interconnect metal lines. However, this scheme is limited to metal lines running in any one particular direction which reduces its applicability.

U.S. Pat. No. 4,309,812 (Horng et al.), assigned to the instant assignee, and the disclosure of which is incorporated herein by reference, uses the above scheme to make closely spaced device contacts.

U.S. Pat. No. 5,326,426 (Tam et al.) utilize layers of different insulating material to provide a reflective coating for a laser mask.

U.S. Pat. No. 5,403,779 (Joshi et al.), assigned to the instant assignee, and the disclosure of which is incorporated herein by reference, teaches use of an organic dielectric layer sandwiched between inorganic dielectric layers.

It is well within the experience of artisans in this field that chemical/mechanical polishing of an organic layer produces debris thereby causing defects like metal opens and holes in the next level of dielectric.

U.S. Pat. No. 5,404,635 (Das) teaches use of a single dielectric layer to act as a spacer and an etch stop to fabricate thin film magnetic head.

U.S. Pat. No. 5,252,516 (Nguyen et al.), assigned to the assignee of the instant invention and the disclosure of which is incorporated herein by reference, teaches the use of a composite insulator comprised of a relatively thick layer of a reactively ion etchable dielectric and covered with a thin layer of an dielectric resistant to reactive etching.

U.S. Pat. No. 5,466,639 (Ireland), teaches double mask process for forming trenches and contacts during the formation of a semiconductor memory device. He shows another application of composite insulator to sequentially etch dielectric for the purpose of double damascene. Ireland uses a set of 3 dielectric layers to make cavity which consists of via stud and line patterns. However, the combination of three distinct layers of insulators causes charge trapment and dielectric losses.

U.S. Pat. No. 5,518,963 (Park), discloses a method for forming metal interconnection of semiconductor device. He uses insulating layer to etch a hole in one insulator while the second insulator protects the metal underneath from exposure to harsh etchants of the first insulator.

Artisans in the field of semiconductor integrated circuits are cognizant that multiple dielectric layers not only cause process complications and cost increase but more significantly it impedes the device functionality due to increased capacitance.

Thus, despite repeated efforts, and various schemes in the prior art, problems of leakage, short circuits, process yield, electromigration failure etc., remain and better methods, necessarily with simpler and fewer process steps, for making an integrated circuit pattern need to be developed.

PURPOSES AND SUMMARY OF THE INVENTION

The invention is a novel structure and a process for forming sub-half-micron multi-level high density electrical interconnect structures for integrated circuits.

Therefore, one purpose of this invention is to provide a structure and a process that will provide a means for fabricating an interconnection circuitry of sub-half-micron dimension with improved process yield, reliability and circuit performance.

Another purpose of this invention is to provide an interconnection process to prevent formation of undesired metal spikes.

Still another purpose of this invention is to prevent inter level short, or reliability exposing metal spike, caused by misalignment during a double damascene process.

Yet another purpose of this invention is to provide a thin insulating etch barrier over the insulator and which is self aligned with a via plug.

Still yet another purpose of the invention is to provide a minimum number of the etch barrier dielectric layers to reduce its effect on capacitance increase.

Therefore, in one aspect this invention comprises a method of forming multilevel interconnection lines and via-plugs of high conductivity metallurgy on top of a planarized substrate, said method comprising the steps of:

(a) on a substrate having at least one first electrically conductive feature surrounded by at least one layer of a first insulator, selectively removing a portion of said first insulator layer and exposing a portion of said first conductive feature, (b) depositing at least one second layer of insulation over said exposed portion of said first conductive feature and said first insulator layer, (c) selectively removing said second layer of insulation such that said exposed portion of said first conductive feature is again exposed and is substantially coplaner with said second layer of insulation, (d) depositing at least one third layer of insulation over said first conductive feature and said second insulation layer, (e) depositing at least one fourth layer of insulation over said third layer of insulation, (f) forming at least one first blind hole in said third and said fourth layer of insulation such that at least a portion of the surface of said first electrically conductive feature is exposed, (g) depositing at least one second electrically conductive feature in said at least one first blind hole, such that at least a portion of said second feature is in direct contact with at least a portion of said first feature, (h) depositing at least one fifth layer of insulation over said second electrically conductive feature and said fourth insulation layer, (i) forming at least one second blind hole in said fifth layer of insulation such that at least a portion of the surface of said second electrically conductive feature is exposed, (j) depositing at least one third electrically conductive feature in said at least one second blind hole, such that at least a portion of said third feature is in direct contact with at least a portion of said second feature, and thereby forming said multilevel interconnection lines and via-plugs of high conductivity metallurgy on top of a planarized substrate.

In another aspect this invention comprises a method of forming multilevel interconnection lines and via-plugs of high conductivity metallurgy on top of a planarized substrate, said method comprising the steps of:

(a) on a substrate having at least one first electrically conductive feature surrounded by at least one layer of a first insulator, selectively removing a portion of said first insulator layer and exposing a portion of said first conductive feature, (b) depositing at least one second layer of insulation over said exposed portion of said first conductive feature and said first insulator layer, (c) selectively removing said second layer of insulation such that said exposed portion of said first conductive feature is again exposed and is substantially coplaner with said second layer of insulation, (d) depositing at least one third layer of insulation over said first conductive feature and said second insulation layer, (e) depositing at least one fourth layer of insulation over said third layer of insulation, (f) forming at least one first blind hole in said third and said fourth layer of insulation such that at least a portion of the surface of said first electrically conductive feature is exposed, (g) depositing at least one second electrically conductive feature in said at least one first blind hole, such that at least a portion of said second feature is in direct contact with at least a portion of said first feature, (h) depositing at least one fifth layer of insulation over said second electrically conductive feature and said fourth insulation layer, (i) forming at least one second blind hole in said fifth layer of insulation such that at least a portion of the surface of said second electrically conductive feature is exposed, (j) depositing at least one third electrically conductive feature in said at least one second blind hole, such that at least a portion of said third feature is in direct contact with at least a portion of said second feature, (k) selectively removing a portion of said fifth layer of insulation such that a portion of said third electrically conductive feature is exposed and protrudes above said fifth layer of insulation, (l) depositing at least one sixth layer of insulation over said exposed portion of said third electrically conductive feature and said fifth insulator layer, (m) selectively removing said sixth layer of insulation such that the surface of said third electrically conductive feature is exposed and is substantially coplaner with said sixth layer of insulation, (n) depositing at least one seventh layer of insulation over said third electrically conductive feature and said sixth layer of insulation, (o) forming at least one third blind hole in said seventh layer of insulation such that at least a portion of the surface of said third electrically conductive feature is exposed, (p) depositing at least one fourth electrically conductive feature in said at least one third blind hole, such that at least a portion of said fourth feature is in direct contact with at least a portion of said third feature, and thereby forming said multilevel interconnection lines and via-plugs of high conductivity metallurgy on top of a planarized substrate.

In yet another aspect this invention comprises a method of forming interconnections between layers of a multilayer substrate comprising the steps of:

(a) providing a substrate including at least one first electrically conductive feature having a surface, said feature being surrounded by at least one layer of a first insulator, (b) selectively removing a portion of said first insulator layer surrounding said first conductive feature and exposing a portion of said first conductive feature such that said surface of said first conductive feature is above the surrounding first insulator layer, (c) depositing at least one etch stop insulator layer over said surface of said first conductive feature and said surrounding first insulator layer, (d) selectively removing said etch stop insulator layer to expose said first electrically conductive feature and leaving at least a portion of said at least one first etch stop insulator layer surrounding said first electrically conductive feature, (e) depositing at least one second insulator layer over said first electrically conductive feature and said portion of said etch stop insulator layer surrounding said first electrically conductive feature, (f) etching said second insulator layer to form at least one blind hole in said second insulator layer such that at least a portion of said first electrically conductive feature and said portion of said etch-stop insulator layer surrounding said first electrically conductive feature is exposed, (g) depositing at least one second electrically conductive feature in said at least one blind hole, such that at least a portion of said second conductive feature is in direct contact with at least a portion of said first conductive feature to form an interconnection between said first and second layers.

In yet another aspect this invention comprises a method of forming an etch barrier between layers of a multilayer substrate comprising the steps of:

(a) providing a substrate including at least one first electrically conductive feature having a surface, said feature being surrounded by at least one layer of a first insulator, (b) selectively removing a portion of said first insulator layer surrounding said first conductive feature and exposing a portion of said first conductive feature such that said surface of said first conductive feature is above the surrounding first insulator layer, (c) depositing at least one first etch stop insulator layer over said surface of said first conductive feature and said surrounding first insulator layer, (d) selectively removing said etch stop insulator layer to expose said first electrically conductive feature and leaving at least a portion of said etch stop insulator layer surrounding said first electrically conductive feature, and thereby forming said etch barrier between layers of a multilayer substrate.

In still yet another aspect this invention comprises a semiconductor substrate having at least one high electrical conductivity interconnect, wherein said substrate comprising at least one p/n junction in electrical contact with a metallic via-plug, at least one first insulator layer over said semiconductor substrate and surrounding said first metallic via-plug, at least a portion of at least one first level of high electrical conductivity interconnection line in contact with said first metallic via-plug, wherein a second and a third insulator layer is over said first insulator layer and surrounds said first level electrical interconnection line, at least a portion of at least one second level electrical interconnection line in contact with said first level electrical interconnection line through at least one high electrical conductivity via-plug, wherein at least a fourth and a fifth insulator layer is over said third insulator layer and surrounds said second level electrical interconnection line, and wherein each adjoining insulator layer is of a different material, and thereby forming said semiconductor substrate having at least one high electrical conductivity interconnect.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

The present interconnection technologies conventionally use tungsten or polysilicon to make contacts to devices. They also act as short local interconnect lines. These local interconnect lines are then joined to high conductivity interconnection lines, such as, for example, $M_1$ line, which is on a higher plane through via-plugs, such as, tungsten via-plugs. The local interconnects are normally separated from the $M_1$ line, usually by a layer of phospho-silicate glass (PSG).

The via-interconnection between the first high conductivity metal lines ($M_1$) and the next level of high conductivity metal lines, such as, for example, $M_2$ line, is preferably made with the same high conductivity metal instead of tungsten.

Figure 1:
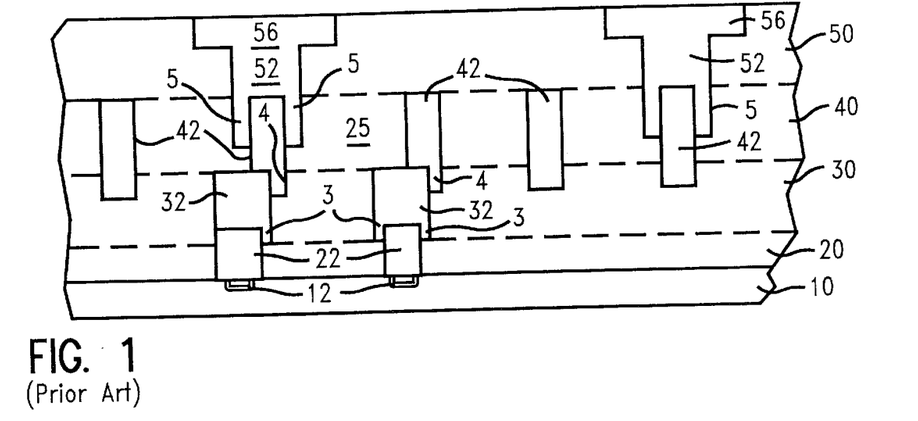
FIG. 1, is a cross-sectional view of a multilevel interconnection pattern of prior art, depicting a plurality of metal spikes caused by the process of the prior art.

A cross-section through a portion of a multi-level interconnection of the prior art is shown in FIG. 1. On a silicon substrate 10, devices or p/n junctions 12, are formed. An insulator layer 20, is then formed over the substrate 10, and using prior art methods interconnect or metallic stud 22, are formed. Another insulator layer 30, is then formed over the insulator layer 20. The insulator layer 30, is then etched and the openings are filled to form interconnect or metallic stud 32. Similarly, insulator layers 40 and 50 are formed and are subsequently etched to form interconnects 42, 52 and 56.

As used herein, the term "etch-stop" refers to a material or materials which are resistant to an etchant, when that etchant is used to remove the insulator material above the etch-stop layer. For example, silicon nitride is an etch-stop when etching a polyimide. An etch-stop layer such as a nitride layer can itself be removed by an etchant specific to it without removing polyimide.

Interconnect 22, such as, short interconnects of tungsten 22, make contacts to diffusion contacts 12. Typically, a liner comprised of titanium and titanium-nitride is used as the diffusion contact.

Interconnect 32, which basically comprises of tungsten via-plugs 32, connects interconnects 22, to high conductivity interconnection lines ($M_1$), such as, interconnect lines 42.

Next, $M_1$ lines comprising of line 42, are connected to the $M_2$ lines comprising of line 56, through via-plug or interconnect 52. The via-plugs 52, could be tungsten, but, it is more desirable that the via-plugs 52, are made of a high electrical conductivity metal. This is desirable for two reasons: firstly, to avoid the presence of dissimilar metal between high conductivity metals lines, such as, lines $M_1$ and $M_2$, which may impede metal atom flow and that may cause electromigration failure; and secondly, for process cost saving, as the via-plug 52, and the $M_2$ interconnection lines 56, can be simultaneously formed by the dual damascene method.

The method for dual damascene is taught by Dalal et al. in U.S. Pat. No. 5,434,451, assigned to the assignee of the present invention, and the disclosure of which is incorporated here by reference.

In the damascene method via-plugs, metal lines or a combination of them, are typically formed by first depositing an insulator layer, such as, for example, a $SiO_2$ insulator layer. Patterns are then reactively ion etched to form via-holes, interconnection lines or a combination of via-hole and interconnection lines in this insulator layer. Liner materials can then be deposited and the rest of the holes or trenches can then be filled with metals. The excess metals from the field regions can be removed by chemical-mechanical polishing.

However, this prior art method has a problem of forming metal spikes, such as, metal spikes 3, 4 and 5. The metal spikes 5, are formed when metal interconnections 52, such as, via-studs 52, does not fully land on the metal interconnection 42, such as, lines 42, due to a variety of reasons, such as, due to a misalignment. Similarly, metal spikes 4, are formed when metal interconnection 42, do not fully land on metal interconnect 32, due to a variety of reasons, such as, due to a misalignment. And, similarly, metal spikes 3, are formed when via-studs 32, do not fully land on metal interconnects 22, due to a variety of reasons, such as, due to a misalignment.

Another reason for this spiking is that during etching of holes for via-studs an over-etch is generally practiced to ensure complete opening of holes across the wafer. This over-etching results in an undesired blind hole, which is normally formed, and which extends down towards the metal layer that is underneath, such as, the via-stud or interconnect layer. Consequently, metal spikes 3, 4 and 5, are formed when the grooves or over-etched blind holes are filled with the metal, as more clearly seen in FIG. 1.

These metal spikes, such as, metal spikes 4 and 5, are the cause of:

(a) time zero yield degradation due to electrical short between adjacent short channel metal wiring lines, especially around area 25, as shown in FIG. 1, if the metal spike 5, is deep or long enough to contact via-studs 32;

(b) exposure to reliability failure due to time dependent leakage generated by the higher electrical field at the tip of the metal spike; and, (c) circuit performance degradation due to increased cross-capacitance between the adjacent lines caused by reduced spacing between the adjacent lines.

Another manifestation of the prior art process is the substantial reduction of the thickness of the high conductivity metal lines overlaying tungsten contact studs, as depicted in FIG. 1. This thickness reduction substantially reduces electromigration life time of high conductivity metal interconnection lines.

However, according to the present invention, a simple and cost effective technique which comprises of unique sequences of process steps is provided which results in interconnection lines that are immune to misalignment, free of deleterious metal spikes, has minimum impact on cross-capacitance, and eliminates the defect with deleterious effect on electromigration.

The invention is generally related to metal filled vias (via-plugs) and either filled or subtractively etched conductor lines on a substrate where the interconnection lines on different vertical levels are separated by a composite of two dielectric layers.

The invention more particularly relates to improvements in sub-half-micron interconnections utilizing an improved double damascene method. It should be understood that the invention is not restricted to any particular metal or dielectric; also, the vias and conductor lines may comprise of same or different metals or layers of same or different metals. Furthermore, it is well known to artisan in the field that metal, as referred here, may be a pure metal, an alloy, or may be comprised of layers of refractory and high electrical conductivity metals or alloys.

Figure 2:
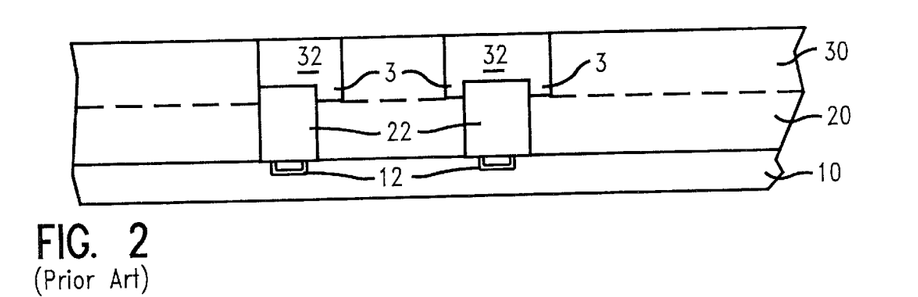
FIG. 2, is a cross-sectional view of a substrate having a plurality of semiconductor devices, metallic via studs, which are substantially planar with the insulator layer, all formed by the process of the prior art.

Referring to the drawings, wherein like reference numerals represent the same or similar parts throughout, and more particularly to FIG. 2, there is shown a cross-section of conventional semiconductor structure comprised of various device contacts and local interconnects or metallic studs 22, typically tungsten with underlayers of titanium and titanium nitride (underlayers not shown), and metallic studs or via-plugs 32. The local interconnects 22, and the via-plugs 32, are formed by methods of the prior art, such as, for example, the damascene process.

As shown in FIG. 2, a pair of insulator layers 20 and 30, define the short interconnects and via studs pattern that are deposited on the surface of the substrate 10. Basically, an insulator layer 20, is first deposited, planarized and then subsequently etched to form opening for metal interconnects. Metal interconnects 22, are then formed in the etched openings in the insulator layer 20. Subsequently, an insulator layer 30, is then deposited and openings for the desired metal interconnects are etched. In order to ensure electrical and mechanical contact, an overetching is done and when the interconnect metal is deposited in the etched opening in the insulator layer 30, one gets interconnect 32, with a spike 3, in the overetching portion of the insulators 20/30.

The excess materials from the metals 22 and 32, which are deposited in the insulator layer 20 and 30, are removed, such as, by Chemical-Mechanical polishing methods of the prior art.

It is preferred that the top surfaces of the via-plug 22 and 32, typically, tungsten, are substantially in plane with surface of surrounding insulator layers 20 and 30, respectively. The insulator layers 20 and 30, are typically deposited $SiO_2$ layers. The spikes 3, that may be formed, are formed in the via-plugs 32, and hence, have no deleterious effects of metal thinning as it would be in a metal conductor line; also there is no metal underneath to form a short. The next step is to form high conductivity metal interconnection.

Figure 3:
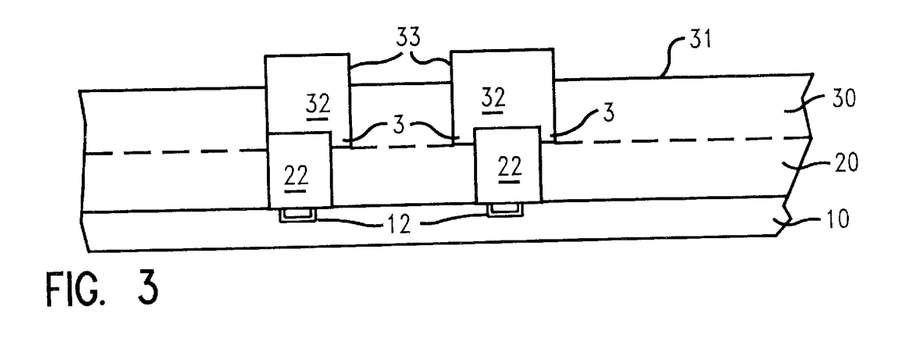
FIG. 3, shows the first step of the present invention for creating a self aligned barrier layer, where a thin layer of semiconductor passivation is etched out allowing for the via plug to protrude above the surface.

The substrate, such as, shown in FIG. 2, is first processed to a point of being ready for the formation of first level of high conductivity interconnection metal lines. As shown in FIG. 3, upper surface 31, of the insulator layer 30, is lightly chemically-mechanically polished, or chemically etched to create protrusion 33, from the metallic stud 32. This could be done by removing, say about 50 nM of the top surface of the insulator layer 30, without affecting the via plug 32, such as, tungsten via plug 32, or the insulator layer 20. Preferably the insulator layer 20, has a different etch chemistry than the insulator layer 30, which is above it, and which is self aligned with the via plug 32.

Figure 4:
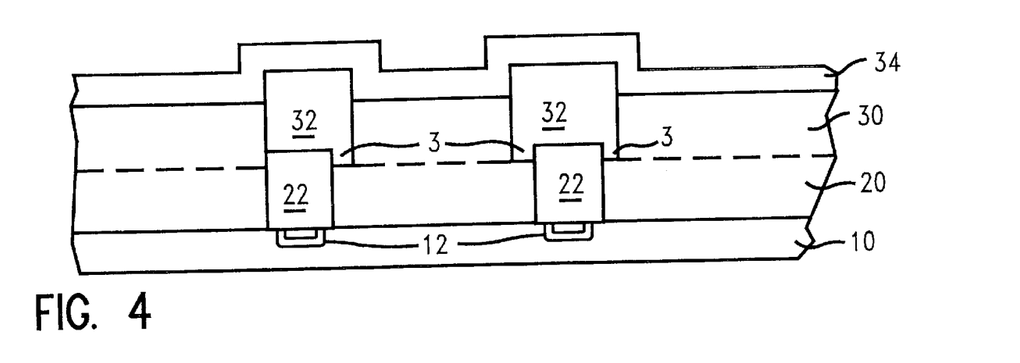
FIG. 4, shows the next step of the process where a thin layer of barrier layer is deposited.

The next step is the deposition of a thin layer of an insulator 34, e.g. MgO, $Y_2O_3$ or $Al_2O_3$, as more clearly seen in FIG. 4. This deposition of the insulator layer 34, can be done by any of the well known methods of the prior art, such as, for example, CVD, PECVD (Plasma Enhanced CVD), sputter deposition, to name a few.

Figure 5:
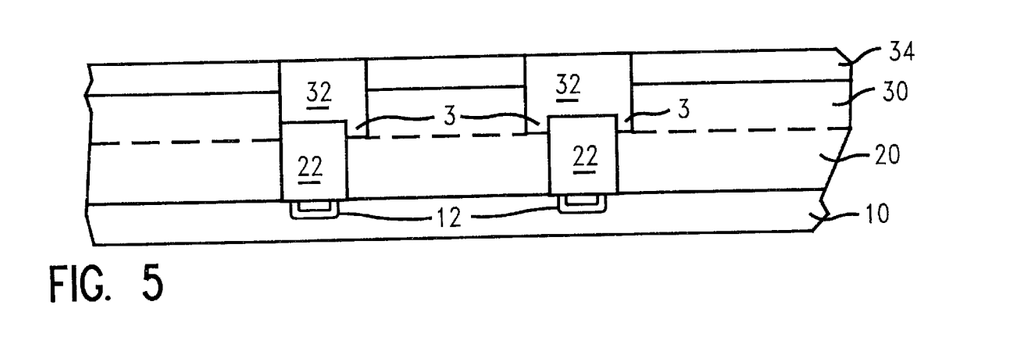
FIG. 5, shows the self aligned barrier layer formed after polishing the structure of FIG. 4.

After the deposition, the insulator layer 34, is then lightly planarized, such as, by chemical-mechanical polishing, such that, the insulator layer 34, over the tungsten plug 32, is removed, so as to expose the surface of the via plug 32, as more clearly seen in FIG. 5, where the insulator layer 34, is self-aligned with the surface of the via plug 32.

Figure 6:
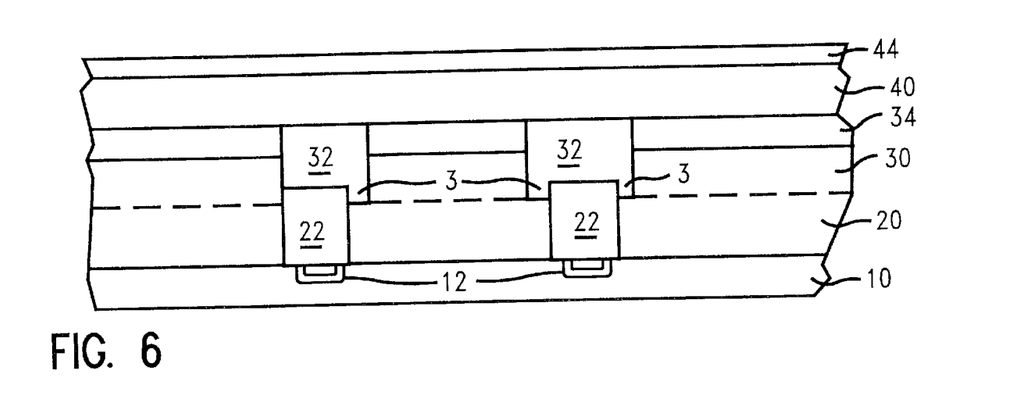
FIGS. 6, 7 and 8, show a sequence of process steps forming a level of high conductivity interconnection.

The interconnection pattern of the 1st level of high conductivity metal is next defined by first depositing a layer of an insulation 40, preferably, $SiO_2$, over the exposed surfaces of the via plug 32, and the insulator layer 34, as clearly seen in FIG. 6, and then a layer of an insulator 44.

Figure 7:
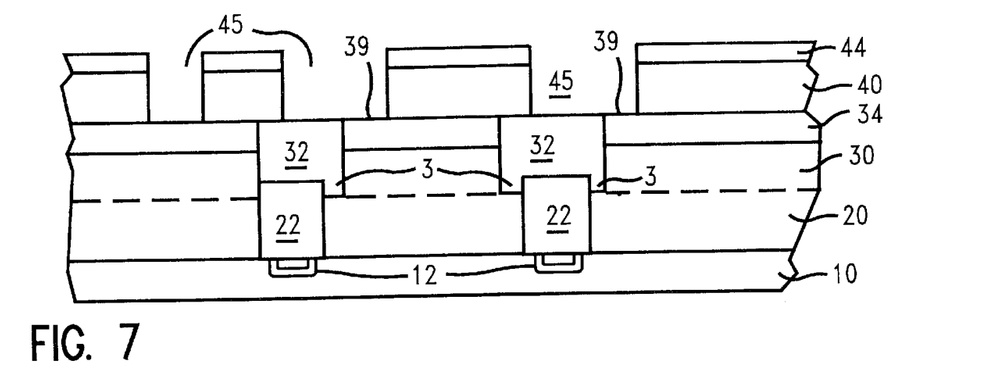

As shown in FIG. 7, a first level of interconnection metal line pattern, is defined by etching insulator layers 44 and 40, to create opening or blind holes 45. Preferably the metal line pattern is photolithographically defined and the insulators are reactively ion etched.

The mutually exclusive etch characteristics of insulators 44 and 34, from that of the insulators 40 and 30, prevents etching of the other insulator layers, such as, insulator layers 34 or 30, while insulator layers 44 or 40, is being etched. As one can clearly see in FIG. 7, that the base of the etched blind hole 45, has not landed squarely on the upper surface of the via-plug 32, but it is a little off-set and it does expose a portion of the surface 39, of the insulator layer 34, however, due to the mutually exclusive etch characteristics of insulators 34 and 40, the etchant for layer 40, will not etch or harm the exposed surface 39, of the insulator layer 34.

Another advantage of the method of the present invention is that the etch barrier insulator layer 34, which is formed without the use of any mask, and which is also self-aligned with features underneath, prevents accidental etching of the insulator on the substrate, thereby preventing thinning of the first level of the high conductivity metal lines, thus, improving the electromigration life time.

This insulator barrier layer 34, also plays another role, and that is that it also prevents accidental etching of the insulator 30, on the substrate while the insulation 40, above this first level of interconnection lines 32, is being etched to form the next level of via plugs, thereby, preventing electrical short circuit between adjacent interconnection lines.

Figure 8:
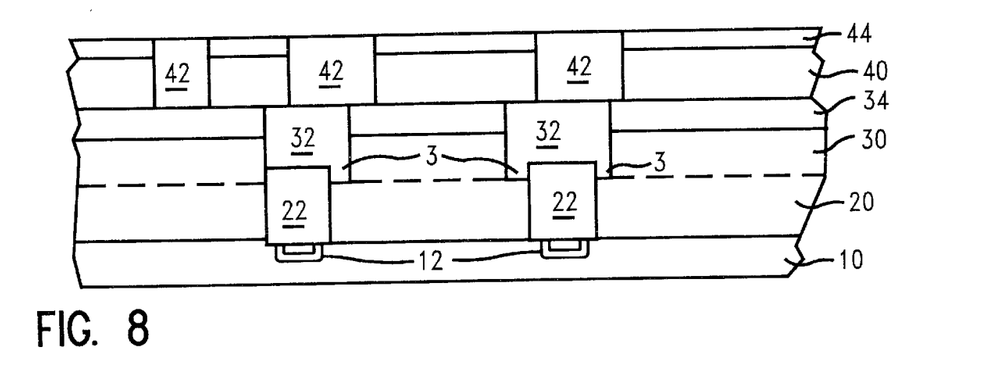

The next step, as shown in FIG. 8, is to deposit at least one electrically conductive material 42, into the blind hole 45, so as to create metal interconnection 42, and then the surface of this structure is planarized. It is preferred that conductive material 42, is a high conductivity metal 42, such as, for example, aluminum, copper or alloys thereof.

For some applications, it is also preferred that the formation of the conductive material 42, is preceded by the placement of a contact metal, for example, titanium or tantalum, and a barrier metal, for example, titanium nitride or tantalum-nitride, and optionally followed by CVD tungsten deposition.

As stated earlier excess material on the surface of this structure or outside the filled blind hole 45, are removed by methods well known in the prior art, such as, for example, chemical-mechanical polishing. This polishing or planarization can be done in a singular or in a sequence of multiple polishing steps, to leave the metal interconnection pattern 42, imbedded and substantially planar with the surface of the surrounding insulator 44, as clearly shown in FIG. 8.

The next step is to form interlevel via-plugs and the next level of interconnection lines. There are two ways this could be accomplished; either by first forming a planarized set of via plugs and then forming the second level interconnection lines, or, by simultaneously forming the via plugs and the interconnection lines by a double damascene method. The double damascene method is a method of choice for better reliability and process ease, a double damascene process is described in U.S. Pat. No. 5,434,451 to Dalal et al. and assigned to the assignee of the present invention, and the disclosure of which is incorporated herein by reference.

Figure 9:
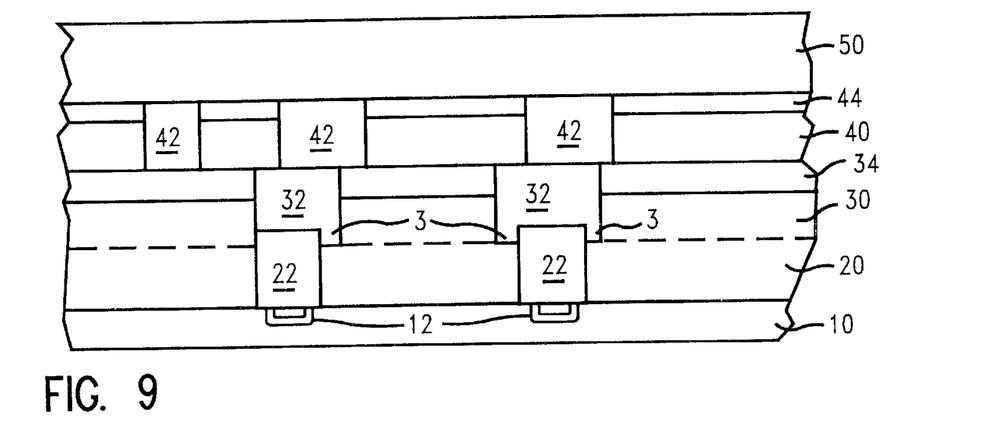
FIGS. 9, 10 and 11, show sequential steps for forming via plugs and the next level of high conductivity interconnection lines using a double damascene method.

Referring now to FIG. 9, the next level of via-plugs and interconnection lines are achieved, by double damascene, by first depositing at least one layer of an insulator 50, say $SiO_2$. It is preferred that the thickness of the insulator layer 50, is at least about 20 percent thicker than the combined desired length of the via-plug and thickness of metal interconnection lines.

Figure 10:
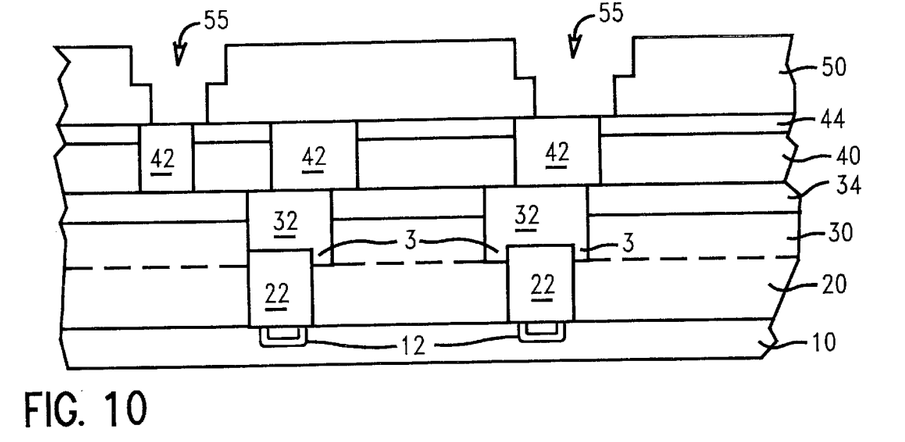

The design for via plugs and the second level of interconnection lines are preferably formed by photo-masking the area and then etching the insulator layer 50, sequentially to create blind holes or openings 55, for via plugs and interconnection lines pattern, as more clearly shown in FIG. 10.

Figure 11:
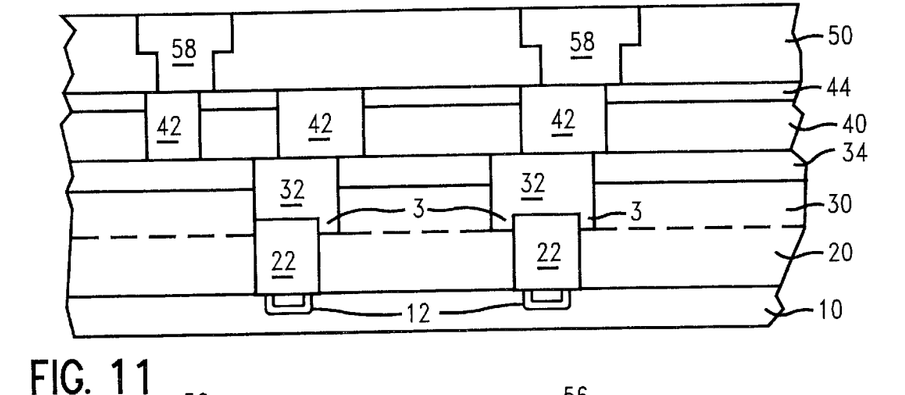

The next step, as shown in FIG. 11, is to deposit at least one electrically conductive material 58, into the blind hole 55, so as to create metal interconnection 58, and then the surface of this structure is planarized. It is preferred that conductive material 58, is a high conductivity metal 58, such as, for example, aluminum, copper or alloys thereof.

For some applications, it is also preferred that the formation of the conductive material 58, is preceded by the placement of a contact metal, for example, titanium or tantalum, and a barrier metal, for example, titanium nitride or tantalum-nitride, and optionally followed by CVD tungsten deposition.

As stated earlier excess material on the surface of this structure or outside the filled blind hole 55, are removed by methods well known in the prior art, such as, for example, chemical-mechanical polishing. This polishing or planarization can be done in a singular or in a sequence of multiple polishing steps, to leave the metal interconnection pattern 58, imbedded and substantially planar with the surface of the surrounding insulator 50, as clearly shown in FIG. 11.

FIG. 11, also illustrates the final structure of one embodiment of this invention where the desired metals for the via plugs and interconnection lines 58, have been deposited and the surface has been planarized to remove any excess materials.

It should be noted that the embodiment of the present invention, where the double damascene method is used, one gets simultaneous formation of via-plugs and the second level interconnection lines.

The formation of individual via plug layer and next interconnection line level is still the most common process of choice. In one embodiment of the present invention, interlevel via-plugs are first defined and followed by definition of second level of interconnection lines. This embodiment is illustrated in FIGS. 8, and 12 through 18.

Figure 12:
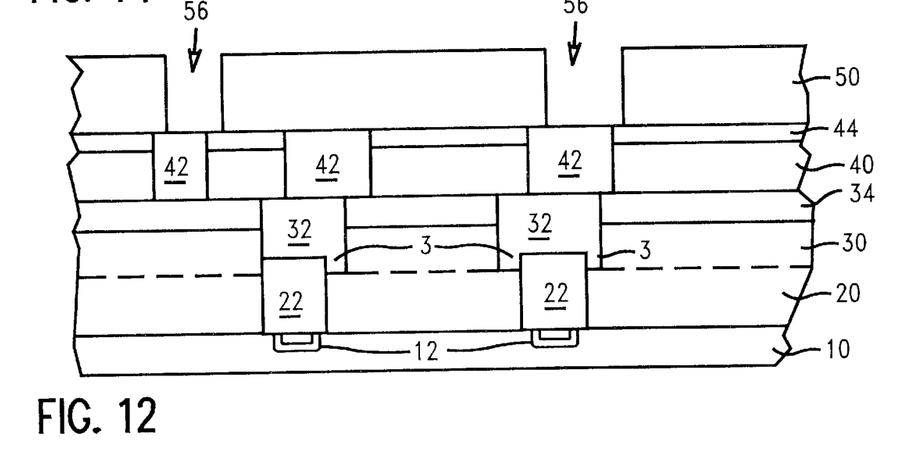
FIGS. 12 and 13, illustrate another embodiment of this invention which uses the structure of FIG. 8, as the base to form the next level of high conductivity interconnection.

On the structure of FIG. 8, a layer of insulator 50, is deposited, and subsequently etched to form blind holes 56, as per via-stud patterns, as shown in FIG. 12.

Figure 13:
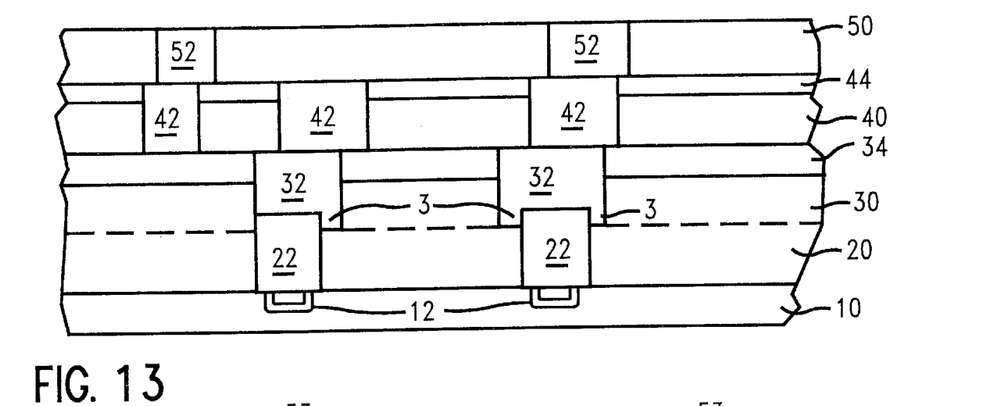

The next step, as shown in FIG. 13, is to deposit at least one electrically conductive material 52, into the blind hole 56, so as to create metal interconnection 52, and then the surface of this structure is planarized. It is preferred that conductive material 52, is a high conductivity metal 52, such as, for example, aluminum, copper or alloys thereof.

For some applications, it is also preferred that the formation of the conductive material 52, is preceded by the placement of a contact metal, for example, titanium or tantalum, and a barrier metal, for example, titanium nitride or tantalum-nitride, and optionally followed by CVD tungsten deposition.

As stated earlier excess material on the surface of this structure or outside the filled blind hole 56, are removed by methods well known in the prior art, such as, for example, chemical-mechanical polishing. This polishing or planarization can be done in a singular or in a sequence of multiple polishing steps, to leave the metal interconnection pattern 52, imbedded and substantially planar with the surface of the surrounding insulator 50, as clearly shown in FIG. 13.

Figure 14:
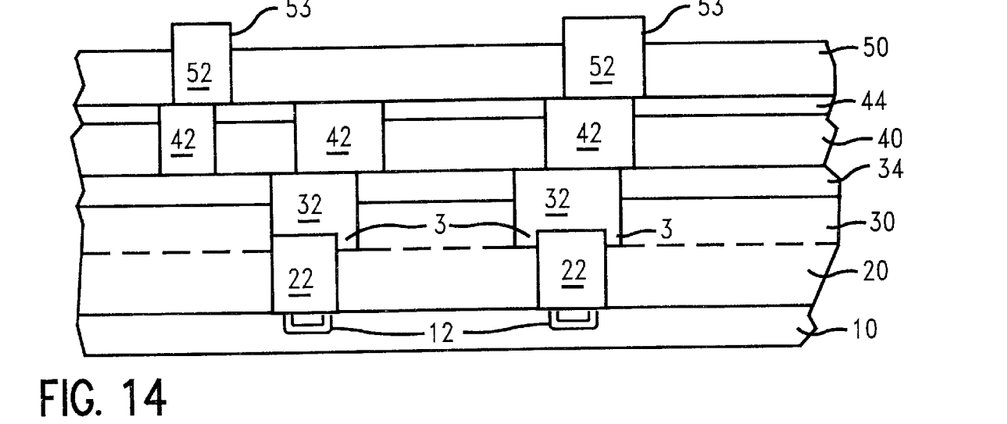
FIG. 14, shows the first step of another embodiment of the present invention for creating a self aligned barrier layer, where a thin layer of semiconductor passivation is etched out allowing for the via plug to protrude above the surface.

As shown in FIG. 14, the upper surface of the insulator layer 50, is lightly chemically-mechanically polished, or chemically etched to create protrusion 53, from the metallic stud 52. This could be done by removing, say about 50 nM of the top surface of the insulator layer 50, without affecting the via plug 52, such as, tungsten via plug 52, or the insulator layer 44. Preferably the insulator layer 44, has a different etch chemistry than the insulator layer 50, which is above it, and which is self aligned with the via plug 52.

Figure 15:
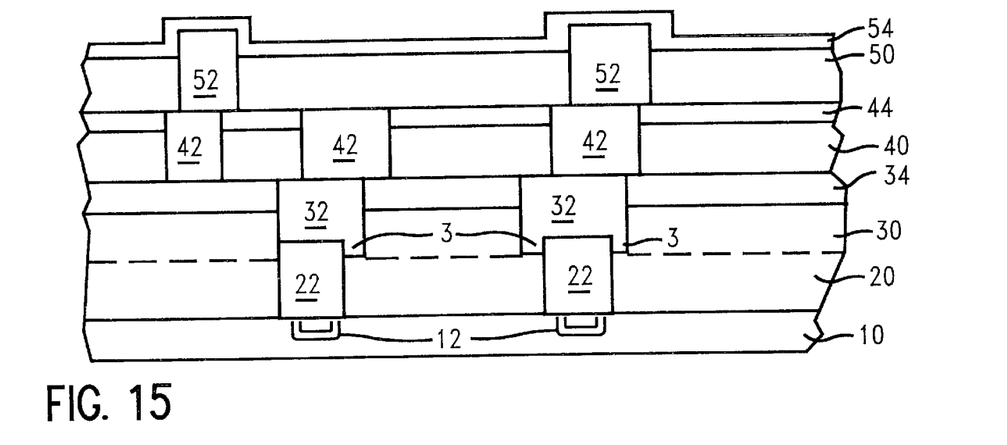
FIGS. 15, 16 and 17, illustrate the process of depositing a layer of barrier layer, planarizing the surface and making of blind holes.

The next step is the deposition of a thin layer of an insulator 54, e.g. $MgO$, $Y_2O_3$ or $Al_2O_3$, as more clearly seen in FIG. 15. This deposition of the insulator layer 54, can be done by any of the well known methods of the prior art, such as, for example, CVD, PECVD, sputter deposition, to name a few.

Figure 16:
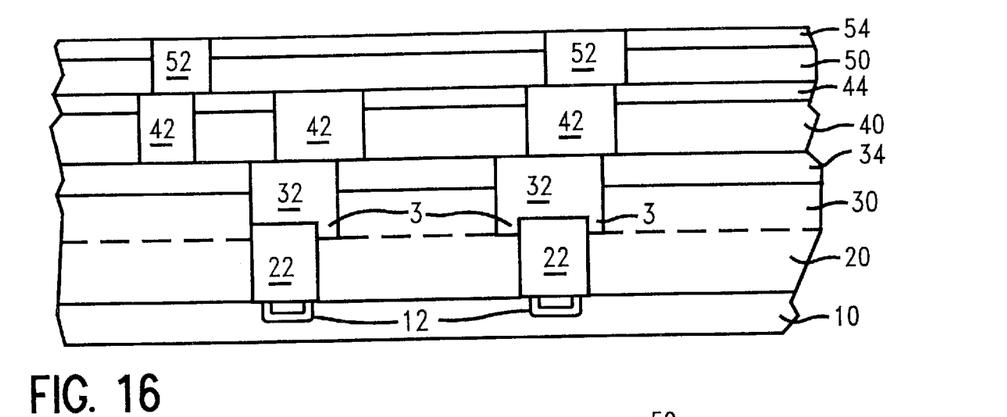

After the deposition, the insulator layer 54, is then lightly planarized, such as, by chemical-mechanical polishing, such that, the insulator layer 54, over the tungsten plug 52, is removed, so as to expose the surface of the via plug 52, as more clearly seen in FIG. 16, where the insulator layer 54, is self-aligned with the surface of the via plug 52.

In the next set of process steps the second level of high conductivity metal interconnection lines are defined. This could be achieved by a damascene method, reactive ion etching of metal or simply chemical etching. Another advantage of this method is that the metals for the via plugs and the second level of interconnection metal lines could be different. This method is particularly of advantage where the first level of interconnection lines are defined by, say, aluminum-copper alloys and the desired metal for the second level of interconnection lines is, say, copper; then tungsten, aluminum-alloys or copper via plugs with optional cladding of titanium, titanium-nitride, tantalum, tantalum-nitride, chromium, tungsten or any combination of them, could be used.

Figure 17:
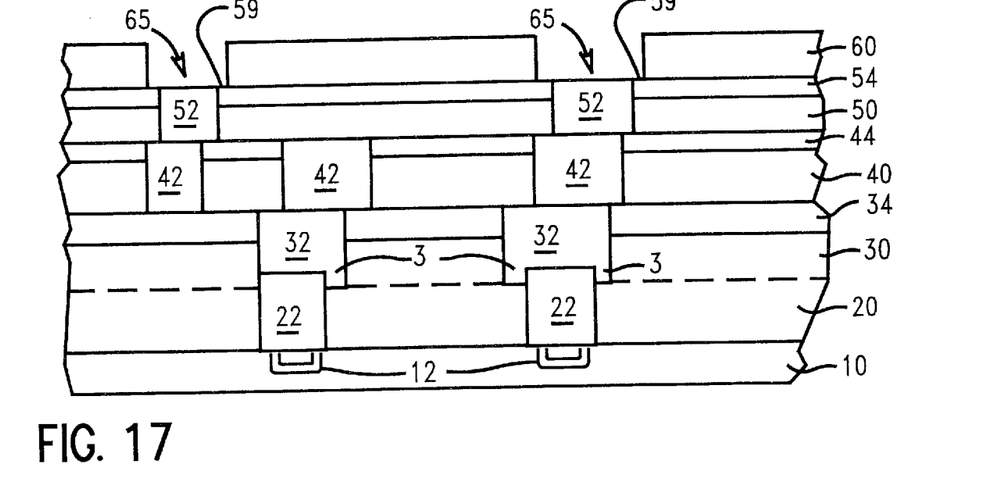

In one embodiment of the present invention where a damascene method to define the second level of interconnection line pattern is used, a layer of an insulation 60, preferably, $SiO_2$, over the exposed surfaces of the via plug 52, and the insulator layer 54, is deposited, as clearly seen in FIG. 17.

As shown in FIG. 17, a second level of interconnection metal line pattern, is defined by etching insulator layer 60, to create opening or blind hole 65. This defining of the interconnection metal line pattern can be done by any of the methods which are well known in the art. However, the preferred method is photolithographically defining the metal line patterns.

The mutually exclusive etch characteristics of insulators 54 and 60, prevents etching of the other insulator layers, such as, insulator layers 44 or 50, while insulator layer 60, is being etched. As one can clearly see in FIG. 17, that the etching of the blind hole 65, for the interconnection pattern, has not landing on upper surface of the via-plug 52, but it is a little off-set and does expose a portion of the surface 59, of the insulator layer 54, however, due to the mutually exclusive etch characteristics of insulators 54 and 60, the etchant for layer 60, will not etch or harm the exposed surface 59, of the insulator layer 54.

Another advantage of the method of the present invention is that the etch barrier insulator layer 54, which is formed without the use of any mask, and which is also self-aligned with features underneath, prevents accidental etching of the insulator on the substrate, thereby preventing thinning of the second level of the high conductivity metal lines, thus, improving the electromigration life time.

This insulator barrier layer 54, also plays another role, and that is that it also prevents accidental etching of the insulator 50, on the substrate while the insulation 60, above the first level of interconnection lines 42, is being etched, thereby, preventing electrical short circuit between adjacent interconnection lines.

Figure 18:
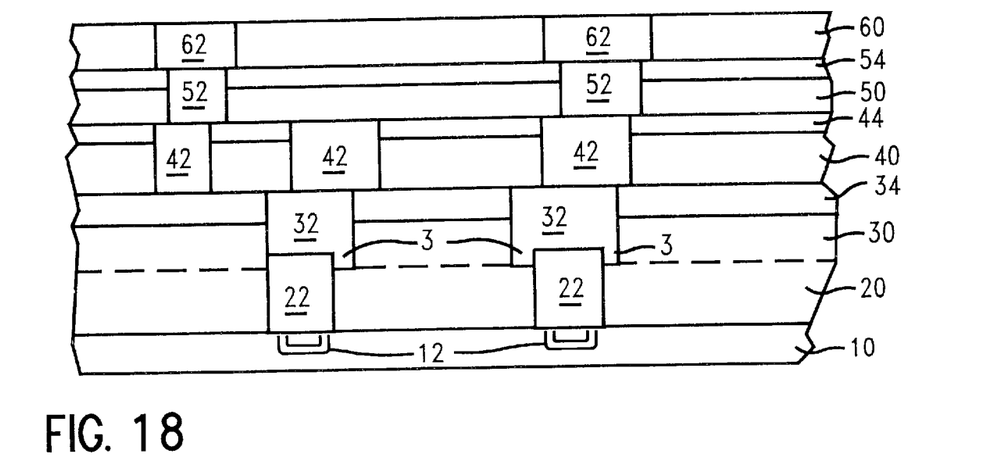
FIG. 18, illustrates the final structure made by another inventive process of this invention.

The next step, as shown in FIG. 18, is to deposit at least one electrically conductive material 62, into the blind hole 65, so as to create metal interconnection 62, and then the surface of this structure is planarized. It is preferred that conductive material 62, is a high conductivity metal 62, such as, for example, aluminum, copper or alloys thereof.

For some applications, it is also preferred that the formation of the conductive material 62, is preceded by the placement of a contact metal, for example, titanium or tantalum, and a barrier metal, for example, titanium nitride or tantalum-nitride, and optionally followed by CVD tungsten deposition.

As stated earlier excess material on the surface of this structure or outside the filled blind hole 65, are removed by methods well known in the prior art, such as, for example, chemical-mechanical polishing. This polishing or planarization can be done in a singular or in a sequence of multiple polishing steps, to leave the metal interconnection pattern 62, imbedded and substantially planar with the surface of the surrounding insulator 60, as clearly shown in FIG. 18.

The layer of insulation could be removed by a method selected from a group comprising reactive ion etching, wet chemical etching, chemical-mechanical polishing, to name a few.

For some applications the first layer of insulation could be removed by a method selected from a group comprising reactive ion etching, sputter etching, ion beam etching, chemical-mechanical polishing, to name a few.

It should be understood that the material for the first electrically conductive feature could be the same as the material for the subsequent electrically conductive feature, or it could be different.

As stated earlier that the electrically conductivity feature could comprise of layers of at least one contact metal, at least one barrier material, at least one high electrically conductive metal or alloy thereof. However, the contact metal could be selected from a group comprising tantalum, titanium, and alloys thereof. While, the barrier material could be selected from a group comprising chromium, chromium/chromium-oxide, cobalt, nickel, palladium, platinum, tantalum, tantalum-nitride, titanium-boride, titanium-nitride, titanium-oxy-nitride, titanium-silicide, titanium-tungsten, tungsten, tungsten-nitride, tungsten-silicon, and alloys thereof. And, the high electrically conductive metal could be selected from a group comprising aluminum, aluminum-copper, copper, copper-hafnium, copper-indium, copper-lanthanum, copper-tin, copper-zirconium, gold, silver, and alloys thereof, to name a few.

For some applications the contact metal and/or the barrier material and/or the high conductivity metal, could be deposited by a method selected from a group comprising sputtering, collimated sputtering, low pressure sputtering, reactive sputtering, electroplating, chemical vapor deposition, evaporation, to name a few.

As stated earlier that one could form at least one capping layer over at least a portion of the electrically conductive feature, and wherein the material for the desired capping layer could be selected from a group comprising chromium, tantalum, tantalum nitride, titanium, titanium nitride, tungsten, tungsten nitride, tungsten-silicon, and alloys thereof, to name a few. And, the capping layer, could be deposited by a method selected from a group comprising sputtering, collimated sputtering, low pressure sputtering, reactive sputtering, electroplating, chemical vapor deposition, evaporation, to name a few.

The material for the different layers of insulation could be selected from a group comprising aluminum-oxide, magnesium-oxide, phospho-silicate glass, polyimide, silicon-nitride, silicon-oxide, yttrium-oxide, flowable oxide, diamond like dielectric, to name a few. Diamond like dielectric, are materials that are single crystalline form of carbon, formed by methods, such as, high electrical discharge at high hydrostatic pressures or PECVD. Flowable oxides are materials that have very low dielectric constants and generally can be spun onto a part, such as, a wafer. Flowable oxide is a commercially available material and sold under various brand names, such as, for example, FOX, a Trademark of Dow Corning Corporation, Midland, Mich., USA.

It should be apparent that given the guidance and the illustrations set forth herein, alternate embodiments of the processes and structures of the present invention may be suggested to a skilled artisan. For example, the insulator layers may be organic, in-organic or any combination of them and deposited by any, or several, of the known methods, such as, for example, CVD, PECVD, sputtering deposition, to name a few. The numbering, first and second level of high conductivity interconnection wiring, is used for the purpose of illustration only and does not bound the use of the present invention to those numbered layers. Likewise, the methods and the materials described for the first and the second level of interconnection wiring can be independently used for defining the circuitry at any desired level of interconnection.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of forming multilevel interconnection lines and via-plugs of high conductivity metallurgy on top of a planarized substrate, said method comprising the steps of:
   (a) on a substrate having at least one first electrically conductive feature surrounded by at least one layer of a first insulator, selectively removing a portion of said first insulator layer and exposing a portion of said first conductive feature,
   (b) depositing at least one second layer of insulation over said exposed portion of said first conductive feature and said first insulator layer,
   (c) selectively removing said second layer of insulation such that said exposed portion of said first conductive feature is again exposed and is substantially coplanar with said second layer of insulation,
   (d) depositing at least one third layer of insulation over said first conductive feature and said second insulation layer,
   (e) depositing at least one fourth layer of insulation over said third layer of insulation,
   (f) forming at least one first blind hole in said third and said fourth layer of insulation such that at least a portion of the surface of said first electrically conductive feature is exposed,
   (g) depositing at least one second electrically conductive feature in said at least one first blind hole, such that at least a portion of said second feature is in direct contact with at least a portion of said first feature,
   (h) depositing at least one fifth layer of insulation over said second electrically conductive feature and said fourth insulation layer,
   (i) forming at least one second blind hole in said fifth layer of insulation such that at least a portion of the surface of said second electrically conductive feature is exposed,
   (j) depositing at least one third electrically conductive feature in said at least one second blind hole, such that at least a portion of said third feature is in direct contact with at least a portion of said second feature, and thereby forming said multilevel interconnection lines and via-plugs of high conductivity metallurgy on top of a planarized substrate.

2. The method of claim 1, wherein a layer of insulation is removed by a method selected from a group consisting of reactive ion etching, wet chemical etching and chemical-mechanical polishing.

3. The method of claim 1, wherein a portion of said first layer of insulation is removed by a method selected from a group consisting of reactive ion etching, sputter etching, ion beam etching and chemical-mechanical polishing.

4. The method of claim 1, wherein the material for said first electrically conductive feature is the same as the material for said second electrically conductive feature.

5. The method of claim 1, wherein the material for said second electrically conductive feature is the same as the material for said third electrically conductive feature.

6. The method of claim 1, wherein the material for said first electrically conductive feature is different than the material for said second electrically conductive feature.

7. The method of claim 1, wherein the material for said second electrically conductive feature is different than the material for said third electrically conductive feature.

8. The method of claim 1, wherein said first electrically conductivity feature comprises of layers of at least one contact metal, at least one barrier material, at least one high electrically conductive metal or alloy thereof.

9. The method of claim 8, wherein said at least one contact metal is selected from a group consisting of tantalum, titanium and alloys thereof.

10. The method of claim 8, wherein said at least one barrier material is selected from a group consisting of chromium, chromium/chromium-oxide, cobalt, nickel, palladium, platinum, tantalum, tantalum-nitride, titanium-boride, titanium-nitride, titanium-oxy-nitride, titanium-silicide, titanium-tungsten, tungsten, tungsten-nitride, tungsten-silicon and alloys thereof.

11. The method of claim 8, wherein said at least one high electrically conductive metal is selected from a group consisting of aluminum, aluminum-copper, copper, copper-hafnium, copper-indium, copper-lanthanum, copper-tin, copper-zirconium, gold, silver, and alloys thereof.

12. The method of claim 8, wherein at least one of said contact metal, said barrier material and said high conductivity metal, is deposited by a method selected from a group consisting of sputtering, collimated sputtering, low pressure sputtering, reactive sputtering, electroplating, chemical vapor deposition and evaporation.

13. The method of claim 1, wherein at least one capping layer is formed over at least a portion of said third electrically conductive feature, and wherein the material for said capping layer is selected from a group consisting of chromium, tantalum, tantalum nitride, titanium, titanium nitride, tungsten, tungsten nitride, tungsten-silicon, and alloys thereof.

14. The method of claim 13, wherein said capping layer, is deposited by a method selected from a group consisting of sputtering, collimated sputtering, low pressure sputtering, reactive sputtering, electroplating, chemical vapor deposition and evaporation.

15. The method of claim 1, wherein said first, second, third, fourth or fifth layer of insulation is selected from a group consisting of aluminum-oxide, magnesium-oxide, phospho-silicate glass, polyimide, silicon-nitride, silicon-oxide, yttrium-oxide, flowable oxide and diamond like dielectric.

16. The method of claim 1, wherein said second or fourth insulator layer is selected from a group consisting of aluminum-oxide, magnesium-oxide, phospho-silicate glass, polyimide, silicon-nitride, silicon-oxide and yttrium-oxide.

17. A method of forming multilevel interconnection lines and via-plugs of high conductivity metallurgy on top of a planarized substrate, said method comprising the steps of:

(a) on a substrate having at least one first electrically conductive feature surrounded by at least one layer of a first insulator, selectively removing a portion of said first insulator layer and exposing a portion of said first conductive feature, (b) depositing at least one second layer of insulation over said exposed portion of said first conductive feature and said first insulator layer, (c) selectively removing said second layer of insulation such that said exposed portion of said first conductive feature is again exposed and is substantially coplanar with said second layer of insulation, (d) depositing at least one third layer of insulation over said first conductive feature and said second insulation layer, (e) depositing at least one fourth layer of insulation over said third layer of insulation, (f) forming at least one first blind hole in said third and said fourth layer of insulation such that at least a portion of the surface of said first electrically conductive feature is exposed, (g) depositing at least one second electrically conductive feature in said at least one first blind hole, such that at least a portion of said second feature is in direct contact with at least a portion of said first feature, (h) depositing at least one fifth layer of insulation over said second electrically conductive feature and said fourth insulation layer, (i) forming at least one second blind hole in said fifth layer of insulation such that at least a portion of the surface of said second electrically conductive feature is exposed, (j) depositing at least one third electrically conductive feature in said at least one second blind hole, such that at least a portion of said third feature is in direct contact with at least a portion of said second feature, (k) selectively removing a portion of said fifth layer of insulation such that a portion of said third electrically conductive feature is exposed and protrudes above said fifth layer of insulation, (l) depositing at least one sixth layer of insulation over said exposed portion of said third electrically conductive feature and said fifth insulator layer, (m) selectively removing said sixth layer of insulation such that the surface of said third electrically conductive feature is exposed and is substantially coplanar with said sixth layer of insulation, (n) depositing at least one seventh layer of insulation over said third electrically conductive feature and said sixth layer of insulation, (o) forming at least one third blind hole in said seventh layer of insulation such that at least a portion of the surface of said third electrically conductive feature is exposed, (p) depositing at least one fourth electrically conductive feature in said at least one third blind hole, such that at least a portion of said fourth feature is in direct contact with at least a portion of said third feature, and thereby forming said multilevel interconnection lines and via-plugs of high conductivity metallurgy on top of a planarized substrate.

18. A method of forming interconnections between layers of a multilayer substrate comprising the steps of:

(a) providing a substrate including at least one first electrically conductive feature having a surface, said feature being surrounded by at least one first insulator layer, (b) selectively removing a portion of said first insulator layer surrounding said first conductive feature and exposing a portion of said first conductive feature such that said surface of said first conductive feature is above said surrounding first insulator layer, (c) depositing at least one first etch-stop insulator layer over said surface of said first conductive feature and said surrounding first insulator layer, (d) selectively removing said etch-stop insulator layer to expose said first electrically conductive feature and leaving at least a portion of said at least one etch-stop insulator layer surrounding said first electrically conductive feature, (e) depositing at least one second insulator layer over said first electrically conductive feature and said portion of said etch-stop insulator layer surrounding said first electrically conductive feature, (f) etching said second insulator layer to form at least one blind hole in said second insulator layer such that at least a portion of said first electrically conductive feature and said portion of said etch-stop insulator layer surrounding said first electrically conductive feature is exposed, (g) depositing at least one second electrically conductive feature in said at least one blind hole, such that at least a portion of said second conductive feature is in direct contact with at least a portion of said first conductive feature to form an interconnection between said first and second layer.

19. The method of claim 18, wherein in said step (d) selective removal of said etch-stop insulator layer is done by planarizing said electrically conductive feature and said etch-stop insulator layer to expose said first electrically conductive feature and leave at least a portion of said etch-stop insulator layer surrounding said first electrically conductive feature.

20. The method of claim 18, wherein in said step (f) etching of said second insulator layer utilizes an etchant, and wherein said portion of said etch-stop insulator layer surrounding said first electrically conductive feature is substantially resistant to said etchant.

21. A method of forming an etch barrier between layers of a multilayer substrate comprising the steps of:

(a) providing a substrate including at least one first electrically conductive feature having a surface, said feature being surrounded by at least one first insulator layer, (b) selectively removing a portion of said first insulator layer surrounding said first conductive feature and exposing a portion of said first conductive feature such that said surface of said first conductive feature is above said surrounding first insulator layer, (c) depositing at least one first etch-stop insulator layer over said surface of said first conductive feature and said surrounding first insulator layer, (d) selectively removing said etch-stop insulator layer to expose said first electrically conductive feature and leaving at least a portion of said etch-stop insulator layer surrounding said first electrically conductive feature, and thereby forming said etch barrier between layers of a multilayer substrate.

22. The method of claim 21, wherein a portion of said first insulator layer is selectively removed by a method selected from a group consisting of reactive ion etching, sputter etching, wet chemical etching, ion beam etching and chemical-mechanical polishing.

23. The method of claim 21, wherein said first electrically conductive feature comprises at least one contact metal, at least one barrier material, at least one high electrically conductive metal or alloy thereof.

24. The method of claim 23, wherein said at least one contact metal is selected from a group consisting of tantalum, titanium and alloys thereof.

25. The method of claim 23, wherein said at least one barrier material is selected from a group consisting, of chromium, chromium/chromium-oxide, cobalt, nickel, palladium, platinum, tantalum, tantalum-nitride, titanium-boride, titanium-nitride, titanium-oxy-nitride, titanium-silicide, titanium-tungsten, tungsten, tungsten-nitride, tungsten-silicon and alloys thereof.

26. The method of claim 23, wherein said at least one high electrically conductive metal is selected from a group consisting of aluminum, aluminum-copper, copper, copper-hafnium, copper-indium, copper-lanthanum, copper-tin, copper-zirconium, gold, silver, and alloys thereof.

27. The method of claim 23, wherein at least one of said contact metal, said barrier material and said high electrically conductive metal, is deposited by a method selected from a group consisting of sputtering, collimated sputtering, low pressure sputtering, reactive sputtering, electroplating, chemical vapor deposition and evaporation.

28. The method of claim 18, wherein a portion of said first insulator layer is selectively removed by a method selected from a group consisting of reactive ion etching, sputter etching, wet chemical etching, ion beam etching and chemical-mechanical polishing.

29. The method of claim 18, wherein said first electrically conductive feature comprises at least one contact metal, at least one barrier material, at least one high electrically conductive metal or alloy thereof.

30. The method of claim 29, wherein said at least one contact metal is selected from a group consisting of tantalum, titanium and alloys thereof.

31. The method of claim 29, wherein said at least one barrier material is selected from a group consisting of chromium, chromium/chromium-oxide, cobalt, nickel, palladium, platinum, tantalum, tantalum-nitride, titanium-boride, titanium-nitride, titanium-oxy-nitride, titanium-silicide, titanium-tungsten, tungsten, tungsten-nitride, tungsten-silicon and alloys thereof.

32. The method of claim 29, wherein said at least one high electrically conductive metal is selected from a group consisting of aluminum, aluminum-copper, copper, copper-hafnium, copper-indium, copper-lanthanum, copper-tin, copper-zirconium, gold, silver, and alloys thereof.

33. The method of claim 2, wherein at least one of said contact metal, said barrier material and said high electrically conductive metal, is deposited by a method selected from a group consisting of sputtering, collimated sputtering, low pressure sputtering, reactive sputtering, electroplating, chemical vapor deposition and evaporation.

\* \* \* \* \*